(12) United States Patent
Fusegawa et al.

(10) Patent No.: US 7,326,395 B2
(45) Date of Patent: Feb. 5, 2008

(54) METHOD FOR PRODUCING A SINGLE CRYSTAL AND SILICON SINGLE CRYSTAL WAFER

(75) Inventors: Izumi Fusegawa, Nishishirakawa-gun (JP); Nobuaki Mitamura, Nishishirakawa-gun (JP); Takahiro Yanagimachi, Nishishirakawa-gun (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 39 days.

(21) Appl. No.: 10/568,186

(22) PCT Filed: Aug. 13, 2004

(86) PCT No.: PCT/JP2004/011685

§ 371 (c)(1),
(2), (4) Date: Mar. 3, 2006

(87) PCT Pub. No.: WO2005/019506

PCT Pub. Date: Mar. 3, 2005

(65) Prior Publication Data

US 2006/0236919 A1    Oct. 26, 2006

(30) Foreign Application Priority Data

Aug. 20, 2003  (JP) .............................. 2003-296837

(51) Int. Cl.
*C01B 33/26* (2006.01)

(52) U.S. Cl. ................ 423/328.2; 117/19; 117/20; 117/217

(58) Field of Classification Search ............ 117/13, 117/19, 20, 217, 218, 222, 932; 257/63; 423/328.2

See application file for complete search history.

(56) References Cited

U.S. PATENT DOCUMENTS 6,334,896 B1 * 1/2002 Iida et al. .................. 117/20

(Continued)

FOREIGN PATENT DOCUMENTS

JP    A-07-041383    2/1995

(Continued)

OTHER PUBLICATIONS

Makoto Takiyama et al.; "Dielectric Degradation of Silicon Dioxide Films Cased by Metal Contaminations"; *Ultra Clean Technology*; vol. 5, No. 5/6; Nippon Steel Corporation; pp. 345-359. (with abstract), year 2000.

*Primary Examiner*—Felisa Hiteshew
(74) *Attorney, Agent, or Firm*—Oliff & Berridge PLC

(57) ABSTRACT

The present invention is a method for producing a single crystal in accordance with Czochralski method by flowing an inert gas downward in a chamber 1 of a single crystal-pulling apparatus 11 and surrounding a single crystal 3 pulled from a raw material melt 2 with a gas flow-guide cylinder 4, wherein when a single crystal within N region outside OSF region generated in a ring shape in the radial direction of the single crystal is pulled, the single crystal within N region is pulled in a condition that flow amount of the inert gas between the single crystal and the gas flow-guide cylinder is 0.6 D(L/min) or more and pressure in the chamber is 0.6 D(hPa) or less, in which D (mm) is a diameter of the single crystal to be pulled. It is preferable that there is used the gas flow-guide cylinder that Fe concentration is 0.05 ppm or less, at least, in a surface thereof. Thereby, there is provided a method for producing a single crystal, wherein in the case that a single crystal is produced by an apparatus having a gas flow-guide cylinder in accordance with CZ method, the single crystal has low defect density and Fe concentration can be suppressed to be $1 \times 10^{10}$ atoms/cm$^3$ or less even in a peripheral part thereof.

9 Claims, 5 Drawing Sheets

U.S. PATENT DOCUMENTS

| | | | |
|---|---|---|---|
| 6,913,646 B2 * | 7/2005 | Sakurada et al. | 117/13 |
| 7,129,123 B2 * | 10/2006 | Sakurada et al. | 438/166 |
| 7,226,507 B2 * | 6/2007 | Mitamura et al. | 117/13 |
| 2002/0157600 A1 | 10/2002 | Fusegawa et al. | |
| 2003/0116082 A1 | 6/2003 | Sakurada et al. | |

FOREIGN PATENT DOCUMENTS

| | | |
|---|---|---|
| JP | A-08-330316 | 12/1996 |
| JP | A-09-202684 | 8/1997 |
| JP | A-11-147786 | 6/1999 |
| JP | A-2000-327485 | 11/2000 |
| JP | A-2002-201093 | 7/2002 |
| WO | WO 01/63027 A1 | 8/2001 |
| WO | WO 01/81661 A1 | 11/2001 |

* cited by examiner

METHOD FOR PRODUCING A SINGLE CRYSTAL AND SILICON SINGLE CRYSTAL WAFER

This application is a 371 of PCT/JP04/11685 Aug. 13, 2004.

TECHNICAL FIELD

The present invention relates to a method for producing a single crystal that is used in semiconductor device production, particularly relates to a method for producing by Czochralski method a silicon single crystal with extremely high quality in which density of grown-in defects is small and a concentration of heavy metal impurity such as Fe in a peripheral part is reduced.

BACKGROUND ART

It is remarkable that semiconductor integrated circuit devices have been highly integrated and therewith developed to be finer. For improving process yield of device production, there is strong requirement for enlargement in size and higher quality of a wafer used as a substrate. Items which relate to crystal quality such as oxygen concentration of a substrate and heavy metal impurity affect property of a semiconductor integrated circuit device (See, Ultra Clean Technology Vol. 5 NO 5/6 "heavy-metal contamination and oxide-film defects of a silicon wafer"), particularly it has been reported that dielectric breakdown strength of a gate oxide film of MOS is degraded by heavy-metal contamination such as Fe, and the like. Moreover, in the case that a silicon single crystal is contaminated by heavy metal, this has a great influence on lifetime of minority carriers and has possibilities of causing problems in property of the semiconductor integrated circuit device.

Moreover, in particular, as an important point for improving process yield in device production in recent years, improvement of device yield in a peripheral part of a wafer has become a problem. Therefore, it has become important to reduce contamination of heavy metal such as Fe in the peripheral part of a wafer. As a cause of the heavy-metal contamination of a single crystal, there is impurity mixed in melt. And, it was recently found that Fe (iron) released from a gas flow-guide cylinder and such adheres to a single crystal during the pulling.

In CZ method, in particular, in the case that a silicon single crystal having a large diameter of 200 mm or more is grown, there is frequently used an apparatus in which a gas flow-guide cylinder so as to surround the single crystal pulled from a raw material melt is disposed. The gas flow-guide cylinder is also important for straightening flow of an inert gas provided in a chamber during the growth and efficiently exhausting out of the furnace a silicon oxide that evaporates from the melt. As a general gas flow-guide cylinder, a carbon material such as a graphite member is used and disposed to be close to a crystal by a distance in the range of 10 mm to 200 mm from the crystal or further by a distance of 10 to 100 mm. Moreover, as material of the gas flow-guide cylinder, high melting point metal such as tungsten or molybdenum is occasionally used. Furthermore, in the case that an appropriate cooling medium is used, stainless or copper can be used as material of the gas flow-guide cylinder.

However, if a heavy-metal component such as Fe is released from the gas flow-guide cylinder, it adheres to a crystal surface during the growth, and Fe is diffused toward the crystal center from the crystal periphery along with the later growth in a cooling process from an ultra high temperature during the crystal growth to a room temperature, particularly metal contamination is occasionally caused in the peripheral part of the crystal.

As measures for heavy-metal contamination caused by the gas flow-guide cylinder as described above, it has been proposed that a surface of the gas flow-guide cylinder is coated by a high-purity coating film of pyrolytic graphite that a Fe concentration is suppressed to be very low, or the like (see, International Publication WO 01-81661). By coating a surface of a gas flow-guide cylinder as described above, release of a Fe component from the gas flow-guide cylinder can be suppressed and Fe concentration even in a peripheral part of a grown single crystal can be suppressed to be low.

On the other hand, as devices become highly integrated in recent years, it is also demanded to reduce grown-in defects such as FPD, LSTD, and COP in a wafer. Grown-in defects are defects caused by single crystal growth which are induced in a crystal during growth when a silicon single crystal is grown by CZ method.

Hereinafter, there will be described relation between a pulling rate when a silicon single crystal is grown by CZ method and defects in the silicon single crystal to be grown. It is known that in the case that a growth rate V is changed from a high speed to a low speed in the direction of the crystal axis by a CZ pulling apparatus, a cross-section in an axial direction of the single crystal can be obtained as a defect distribution view as shown in FIG. 8.

V region in FIG. 8 is a region having a number of Vacancies, i.e. concave parts generated by silicon atom shortage, such as holes. I region is a region having a number of dislocations or a number of bodies of excess silicon atoms which are generated by existence of Interstitial-Si, which is an excess silicon atom. Neutral region (N region) having no or little shortage or excess of atoms exists between the V region and the I region. Moreover, defects, which are referred to as OSF (Oxidation Induced Stacking Fault) in the vicinity of a boundary of the V region, are distributed in a ring shape (OSF ring) when viewed in a cross-section in a vertical direction to crystal growth axis (in a surface of the wafer).

In the case that the growth rate is relatively high, grown-in defects such as FPD, LSTD, and COP originated from voids that vacancy-type point defects aggregate exist at high density in the entire region in the radial direction of a single crystal and the region that these defects exist becomes V region. As the growth rate becomes lower, OSF ring is generated from the crystal periphery and N region is generated in the outside (the lower rate side) of the ring. Furthermore, if the growth rate is low, the OSF ring shrinks to the center of the wafer and disappears and the entire plane thereof becomes N region. If the growth rate is further lower, L/D (Large Dislocation: general designation of "interstitial dislocation loop", such as LSEPD or LFPD) defects (large dislocation clusters), which are thought to be originated from dislocation loops that interstitial silicones aggregate, exist at low density and the region that these defects exist becomes I region (occasionally referred to as L/D region).

N region outside the OSF region between the V region and the I region becomes a region having low defect density, in which there exist neither FPD, LSTD, and COP that are originated from vacancies, nor LSEPD and LFPD that are originated from interstitial silicones. In recent days, it has been found that if the N region is further categorized, as shown in FIG. 8, there are Nv region (a region where vacancies exist predominately) next to the outside of the OSF ring and Ni region (a region where interstitial silicones exist predominately) next to I region. When thermal oxidation treatment is performed, in the Nv region, amount of precipitated oxygen is rich, and in the Ni region, amount of precipitated oxygen is little.

In recent years, in CZ method, by setting growth rate of a crystal to be low or by setting a structure inside a furnace of the CZ pulling apparatus for gradual cooling of the crystal, it has become possible to produce a silicon crystal with low defect density in the entire crystal.

For example, there is proposed a method that by controlling thermal history during crystal growth, point defects are reduced (See, Japanese Patent Application Laid-open (kokai) No. 9-202684, and No. 7-41383). Moreover, by controlling V/G, which is a ratio of a pulling rate (V) to an axial temperature gradient (G) at a solid-liquid interface in a crystal, it has become possible to produce a crystal that N region is expanded in the horizontal entire plane (the entire plane of a wafer) (See, Japanese Patent Application Laid-open (kokai) No. 8-330316 and No. 11-147786).

In the case that a crystal with low defect density is grown as described above, for improving process yield of device production, it is also important to reduce contamination of heavy metal such as Fe.

However, when a silicon single crystal having low defect density is produced, even if there is used a gas flow-guide cylinder coated with a coating film that Fe concentration is extremely low as described above, Fe concentration in a peripheral part of the crystal cannot be suppressed to be sufficiently low, and it has been difficult to make $1 \times 10^{10}$ atoms/cm$^3$ or less like demands in recent years. Therefore, there has been a problem that process yield becomes low in the production of semiconductor devices after that.

Moreover, as a method for producing a silicon single crystal having low defect density with Fe contamination suppressed, there has been proposed a method that raw material is cleaned with fluoric acid and such, and a single crystal ingot is pulled by a constant rate (a solidifying rate) from a melting raw material. Furthermore, after chunked or grained, this is cleaned and melted again, and thereafter a silicon single crystal is grown by controlling V/G (See, Japanese Patent Application Laid-open (kokai) No. 2000-327485). According to such a method, it is supposed that there can be grown a silicon single crystal having no grown-in defects which Fe concentration is reduced to be $2 \times 10^9$ atoms/cm$^3$ or less.

However, in a method for growing a silicon single crystal wherein Fe concentration is reduced by repeating the cleaning of raw material, the melting, and the pulling as described above, cost significantly increases because pulling is performed twice or more. Even if such a method is used, there is a problem that there cannot be avoided Fe contamination caused by a gas flow-guide cylinder during growth.

DISCLOSURE OF THE INVENTION

Accordingly, the present invention was conceived in view of the above problems. A main object of the present invention is to provide a method for producing a single crystal, wherein in the case that a single crystal is produced by an apparatus having a gas flow-guide cylinder in accordance with CZ method, the single crystal has low defect density and Fe concentration can be suppressed to be $1 \times 10^{10}$ atoms/cm$^3$ or less even in a peripheral part thereof.

In order to accomplish the above object, according to the present invention, there is provided a method for producing a single crystal in accordance with Czochralski method by flowing an inert gas downward in a chamber of a single crystal-pulling apparatus and surrounding a single crystal pulled from a raw material melt with a gas flow-guide cylinder, wherein when a single crystal within N region outside OSF region generated in a ring shape in the radial direction of the single crystal is pulled, the single crystal within N region is pulled in a condition that flow amount of the inert gas between the single crystal and the gas flow-guide cylinder is 0.6 D(L/min) or more and pressure in the chamber is 0.6 D(hPa) or less, in which D (mm) is a diameter of the single crystal to be pulled.

If the single crystal within N region is pulled in a condition that flow amount of the inert gas between the single crystal and the gas flow-guide cylinder is 0.6 D(L/min) or more and pressure in the chamber is 0.6 D(hPa) or less as described above, metal components such as Fe released from the gas flow-guide cylinder is induced to exhaust out of the chamber with the inert gas, Fe adhering to a surface of a crystal can be significantly reduced. Therefore, in accordance with such a method, there can be produced a high-quality single crystal, wherein as well as a single crystal has low defect density, Fe concentration can be suppressed to be $1 \times 10^{10}$ atoms/cm$^3$ or less in a peripheral part thereof as required in recent years.

In addition, a gas flow-guide cylinder mentioned in the present invention is not limited to one for straightening flow of an inert gas but is used as a generic term of all members disposed so as to surround a pulled single crystal above the melt surface, such as a heat-insulating member, a heat shield screen, and a cooling cylinder which are disposed for controlling the temperature distribution in the furnace.

Moreover, in the present invention, it is preferable that the single crystal to be pulled is a silicon single crystal.

Because a silicon single crystal has been demanded highly and growth using a gas flow-guide cylinder is frequently performed, the present invention becomes particularly effective.

Moreover, the diameter of the single crystal to be pulled is 200 mm or more.

A silicon single crystal having a diameter of 200 mm or more, particularly 300 mm is produced, and also in the case that a single crystal having such a large diameter is grown, it is necessary that Fe concentration is suppressed to be $1 \times 10^{10}$ atoms/cm$^3$ or less in a peripheral part thereof. However, in the case that a single crystal having a large diameter is grown, the possibility that the crystal is contaminated with Fe becomes high because the pulling rate is lower. Accordingly, in accordance with the present invention, by suppressing Fe contamination effectively and growing a single crystal having a large diameter, high-quality single crystals having a large diameter can be produced at high productivity.

It is preferable that the single crystal within N region is pulled by using the gas flow-guide cylinder that Fe concentration is 0.05 ppm or less, at least, in a surface thereof.

If a single crystal is pulled according to the present invention by using the gas flow-guide cylinder that Fe concentration is extremely reduced, Fe-releasing from a gas flow-guide cylinder can be more reduced and a single crystal with extremely high quality can be obtained.

Furthermore, according to the present invention, a single crystal produced by the method described above is provided. And, from this single crystal, there is provided a silicon single crystal wafer having a diameter of 200 mm or more produced in accordance with Czochralski method, wherein the wafer is occupied by N region outside OSF region generated in a ring shape in the radial direction of a single crystal, and Fe concentration of the entire plane in the radial direction including a peripheral part of the wafer is $1\times10^{10}$ atoms/cm$^3$ or less.

A singe crystal produced by a method of the present invention becomes a single crystal with extremely high quality, wherein the single crystal has low defect density and Fe concentration can be suppressed to be low even in a peripheral part thereof. In particular, if wafers are produced from a silicon single crystal as described above and used as a substrate for semiconductor devices, yield of devices in a peripheral part of the wafer can be improved.

According to the present invention, there can be produced a single crystal within N region having low defect density and prevented from being Fe-contaminated even in a peripheral part thereof. Moreover, a single crystal having high uniformity with regard to lifetime distribution in a plane thereof can be obtained. If semiconductor integrated circuit devices are produced by using wafers obtained from such a single crystal, process yield can be improved.

BEST MODE FOR CARRYING OUT THE INVENTION

Hereinafter, a method for producing a silicon single crystal according to the present invention will be concretely explained in detail with reference to appended drawings. However, the present invention is not limited to this.

The present inventors made diligent studies with regard to Fe contamination of a silicon single crystal grown by CZ method, and the following was found. If a crystal growth rate is high, probability of a Fe component adhering to a crystal surface is low, and even if the component adheres, Fe contamination can be suppressed because time of the component diffusing inside the crystal is short. However, in the case that a crystal with low defect density whose entire crystal is to be N region is produced, even if a gas flow-guide cylinder in which Fe concentration is reduced is used, because the growth rate is slow and thermal history at a high temperature is long, particularly in the case of growing a single crystal having a large diameter of 200 mm or more, probability of the component adhering to the crystal surface is high due to the growth rate becoming lower, and small amount of adhering Fe diffuses inside the crystal and Fe contamination is caused in a peripheral part.

Accordingly, the present inventors thought that even in the case of growing a single crystal having a large diameter and low defect density, Fe adhering to a surface of a single crystal during growth could be reduced by increasing flow amount of a gas, even in a silicon single crystal having low defect density with long thermal history, Fe-diffusing amount toward the crystal center would be small and Fe contamination in a peripheral part could be effectively suppressed.

More analysis was performed in detail. It was found that if the single crystal within N region is pulled in a condition that flow amount of the inert gas between the single crystal and the gas flow-guide cylinder is 0.6 D(L/min) or more and pressure in the chamber is 0.6 D(hPa) or less, in which D (mm) is a diameter of the single crystal to be pulled, the single crystal has low defect density and Fe concentration can be suppressed to be $1\times10^{10}$ atoms/cm$^3$ or less even in a peripheral part thereof. Accordingly, the present invention has been accomplished.

Figure 1:
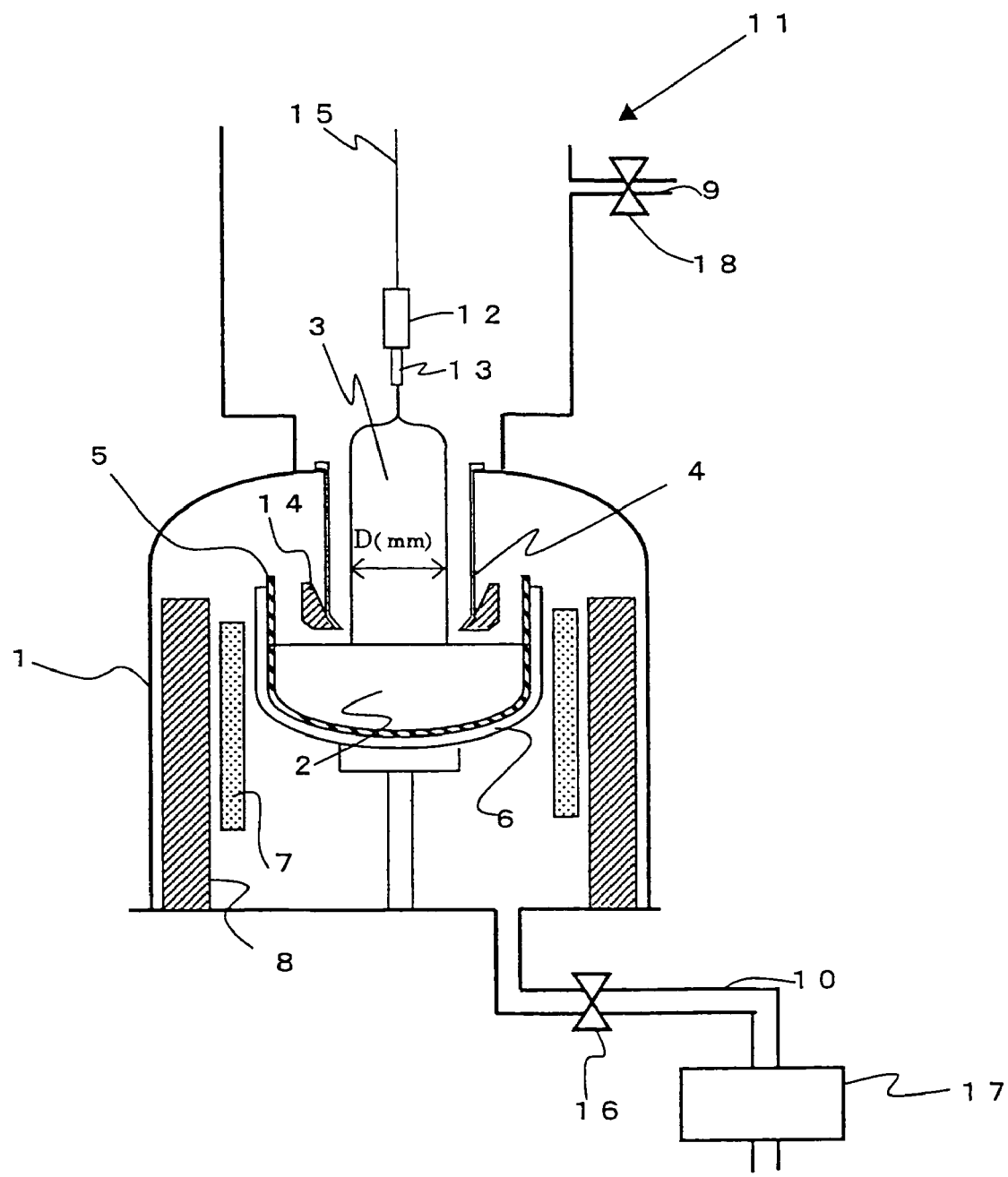
FIG. 1 is a schematic-view showing an example of a single crystal-pulling apparatus.

FIG. 1 shows a schematic view of an example of a single crystal-pulling apparatus that can be suitably used in the present invention. The single crystal-pulling apparatus 11 has crucibles (a quartz crucible 5 and a graphite crucible 6) containing a silicon molten liquid (melt) 2 in a chamber 1, a heater 7 is disposed around the crucibles 5, 6, and furthermore, a heat-insulating member 8 is disposed in an outer circumference thereof. Moreover, at a upper part of the apparatus 11, there is provided a gas-introducing duct 9 for introducing an inert gas such as Ar during growth and a flow-amount adjusting valve 18. And, at a bottom part, a gas-exhausting duct 10 is provided.

Above the crucibles 5, 6, a cylindrical gas flow-guide cylinder 4 surrounding a pulled single crystal 3 is disposed, and furthermore an outer insulating member 14 having a ring shape is provided at a bottom thereof.

In addition, with regard to the gas flow-guide cylinder 4 and the outer insulating member 14 that are used in the present invention, it is preferable that ones having as small heavy-metal components like Fe as possible are used. In particular, it is preferable that ones in which Fe concentration is 0.05 ppm or less, at least, in a surface thereof are used. For example, the gas flow-guide cylinder on which a pyrolytic graphite coating film with high purity having a Fe concentration of 0.05 ppm or less is formed can be suitably used.

If such a pulling apparatus 11 is used, difference between temperature gradient Gc [° C./cm] in the central part of the crystal and temperature gradient Ge [° C./cm] in a peripheral part of the crystal becomes small. For example, temperature in the furnace can also be controlled so that the temperature gradient in the peripheral part of the crystal is lower than that in the crystal center.

In addition, an inner heat-insulating member may be also provided inside the gas flow-guide cylinder 4, or MCZ method may be used that a magnet is placed outside the chamber 1 and magnetic field is applied to a silicon melt 2 in a horizontal direction, a vertical direction, or the like.

When a single crystal is grown, a seed crystal 13 is held by a holder 12 and silicon polycrystal material with high purity is heated at a melting point (about 1420° C.) or more and melted in the crucibles 5, 6. By winding a wire 15 off, a tip end of the seed crystal 13 is contacted or immersed with about the central part of the surface of the melt 2. After then, along with rotating the crucibles 5, 6 and rotating the wire 15, the wire is slowly rewinded. Thereby, growth of a single crystal following the seed crystal 13 is initiated, and thereafter a single crystal ingot 3 having about a columnar shape can be pulled by controlling the pulling rate and the temperature appropriately.

In addition, during the growth, an inert gas such as Ar is introduced from the gas-introducing duct 9, flowed downward in the chamber 1, passed between the pulled single crystal 3 and the gas flow-guide cylinder 4, and thereafter exhausted with a vacuum pump 17 through the exhaust duct 10. At this time, flow amount of the introduced gas can be regulated by adjusting the valve 18, and pressure in the furnace can be regulated by adjusting open degree of a valve 16.

For pulling a single crystal having low defect density and particularly within N region outside OSF region generated in a ring shape in the radial direction thereof, for example, a single crystal may be pulled by controlling to be a growth rate (a pulling rate) between the growth rate of the boundary that OSF region generated in a ring shape disappears in the case of gradually reducing a growth rate from a high rate to a low rate and the growth rate of the boundary that interstitial dislocation loops are generated in the case of more reducing a growth rate gradually.

If a single crystal is grown as described above, a single crystal within N region outside OSF region can be pulled. However, in the case that a single crystal is grown as described above, there is tendency that a pulling rate is relatively slow and thermal history at a high temperature becomes long. Therefore, if a Fe component released from the gas flow-guide cylinder and such adheres to a surface of the single crystal during growth, Fe is diffused inward in the crystal and Fe contamination in a peripheral part of the single crystal is easily caused.

Accordingly, in the present invention, the above-described single crystal within N region is pulled in a condition that flow amount of the inert gas between the single crystal and the gas flow-guide cylinder is 0.6 D(L/min) or more and pressure in the chamber is 0.6 D(hPa) or less, in which D (mm) is a diameter of the single crystal to be pulled. If during the growth, for example, Ar gas is introduced with flow amount according to a diameter of the crystal and flowed downward and additionally adjusted to have a pressure according to a diameter of the crystal as described above, even if a metal component such as Fe is released from the gas flow-guide cylinder, the component with the Ar gas is induced to exhaust out of the furnace. Therefore, Fe and such adhering to the single crystal surface during growth is greatly reduced. Even if thermal history at a high temperature is long, Fe diffusing inward in the crystal can be prevented. As a result, there can be produced a silicon single crystal wherein Fe concentration is extremely reduced even in a peripheral part of the crystal.

Figure 2:
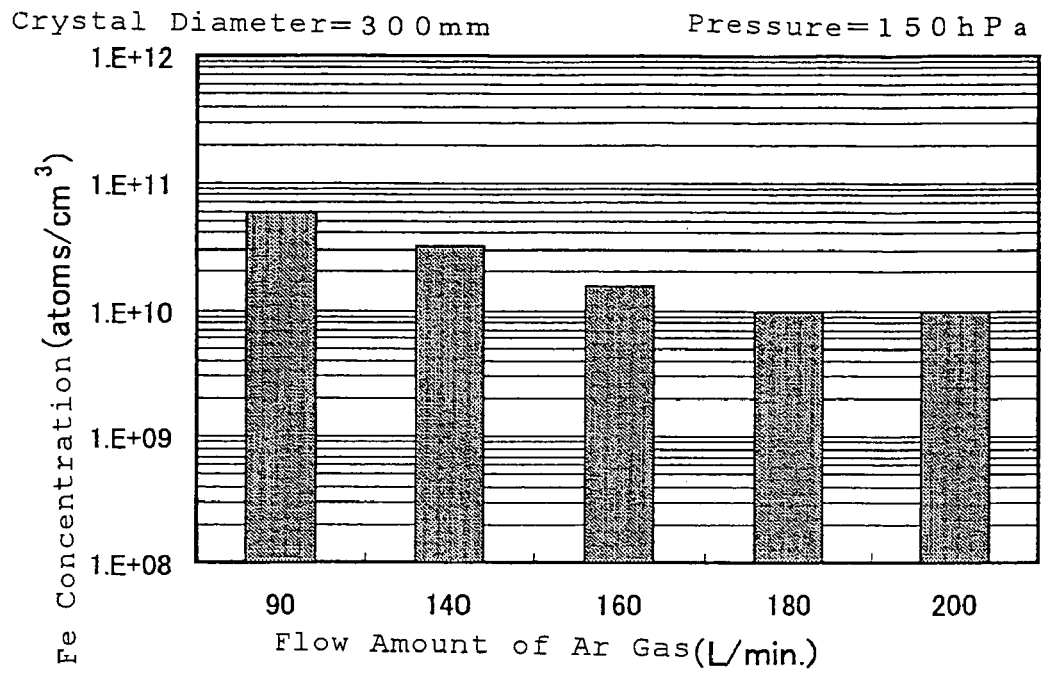
FIG. 2 is a graph showing relation between flow amount of Ar gas and Fe contamination in a peripheral part of a wafer.

FIG. 2 shows relation between flow amount of Ar gas in growth of a silicon single crystal within N region and Fe concentration (average values of detected values) in a peripheral part of a silicon wafer produced from the grown single crystal.

Using a pulling apparatus such as FIG. 1, the present inventors adjusted the valve of the vacuum pump to set the pressure in the chamber to be constant (150 hPa), variously altered the flow amount of Ar gas flowed downward in the chamber, and grew a silicon single crystal within N region (having a diameter of 300 mm). From each of the grown single crystals, through steps of slicing, chamfering, lapping, mirror-polishing, and such, silicon mirror wafers were produced. Then, Fe concentration was measured in a peripheral part (10 mm from an extreme periphery, 10 points) of the obtained silicon wafer.

As shown in FIG. 2, it is found that as flow amount of Ar gas is larger, Fe concentration tends to decrease. In particular, by performing growth with setting the flow amount of Ar gas to be 0.6 D=180 (L/min) or more, Fe concentration can be suppressed to be $1 \times 10^{10}$ atoms/cm$^3$ or less.

Figure 3:
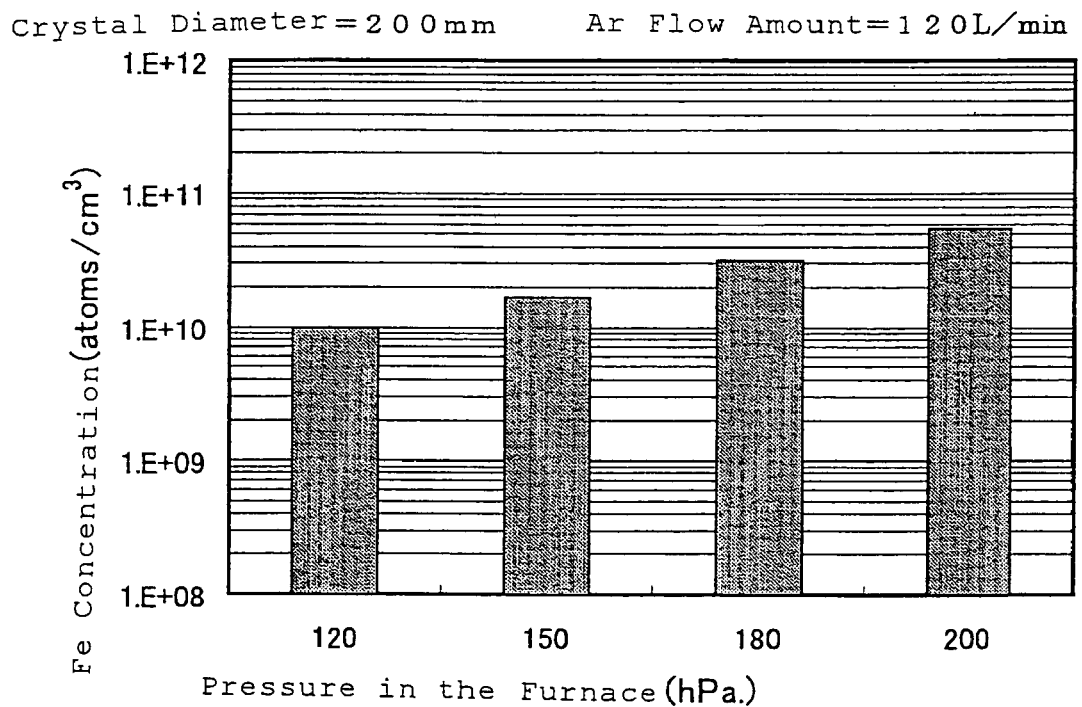
FIG. 3 is a graph showing relation between pressure in a chamber and Fe contamination in a peripheral part of a wafer.

Furthermore, FIG. 3 shows relation between pressure change in a chamber (in a furnace) and Fe concentration in a peripheral part of the crystal when flow amount of Ar gas is constant, 120 L/min (corresponding to 0.6 D), in the case of growing a singe crystal within N region (a diameter D=200 mm).

As shown in FIG. 3, it is found that as pressure of Ar gas in a chamber is smaller, Fe concentration is lower. In particular, Fe concentration of $1 \times 10^{10}$ atoms/cm$^3$ or less can be attained if the pressure in the chamber is 0.6 D=120 (hPa) or less.

A silicon single crystal produced according to the present invention as described above can be a high-quality single crystal that as well as the crystal is within N region in which grown-in defects does not exist or are extremely reduced, Fe concentration of the entire plane in the radial direction including a peripheral part of the single crystal can be suppressed to be $1 \times 10^{10}$ atoms/cm$^3$ or less. Therefore, if semiconductor device production is performed by using this as a substrate, yield in a peripheral part of the substrate is improved, and reduction of production cost as well as improvement of process yield can be accomplished.

In addition, it is desirable that the flow amount of an inert gas is larger in the present invention because Fe concentration can be reduced. However, it is not preferable that the flow amount is too large because gas is wasteful, the grown single crystal is shaked, the melt surface is ruffled, and so forth. Therefore, preferably it is about 10 D or less. Moreover, it is desirable that the pressure is lower because Fe concentration can be reduced. However, if the pressure is too low, degradation of the used quartz crucible is intensified. Therefore, it is preferable that the pressure is 0.01 hPa or more, more preferably, 0.1 hPa or more.

Hereinafter, according to the present invention, Examples and Comparative Example will be explained.

EXAMPLE 1

In a single crystal-pulling apparatus as shown in FIG. 1, after 120 kg of polycrystalline silicon was charged in a quartz crucible having a diameter 56 cm and melted, a seed crystal having a <100> plane was immersed in the silicon melt, and through a necking step, there was grown a silicon single crystal having a diameter of D=200 mm within N region which is doped with boron so that the resistivity thereof becomes 10 Ωcm. As a gas flow-guide cylinder, there was used a body consisting of graphite material, on which a pyrolytic graphite coating film of high purity having a Fe concentration of 0.05 ppm or less was formed by CVD method.

In addition, the growth rate was about 0.5 mm/min, Ar gas was flowed downward along with adjusting the flow amount to 140 L/min (corresponding to 0.7 D) and the pressure in the furnace to 120 hPa (corresponding to 0.6 D) during the growth.

From the grown silicon single crystal, silicon wafers were produced through such general processes required for producing industrially silicon wafers as cylindrically grinding, slicing, lapping, and polishing. Fe distribution in a plane of the wafer was measured.

In addition, the Fe concentration measurement of the wafer was performed by SPV method (Surface Photovoltage Method). Fe solid-solubilized in the boron-doped silicon single crystal was stabilized in a FeB form by binding to boron, which is a dopant, in a room temperature. Binding energy of FeB is about 0.68 eV and most of FeB is dissociated into Fei at about 200° C. Fei form a deep level and therefore functions as a recombination center of minority carriers and depresses diffusion length of minority carriers. That is, the diffusion length of minority carriers is long before heat treatment at about 200° C., however because Fei functions as recombination centers of minority carriers after the heat treatment, the diffusion length of minority carriers is shortened. Fe concentration can be measured by measuring difference between the diffusion length.

Figure 4:
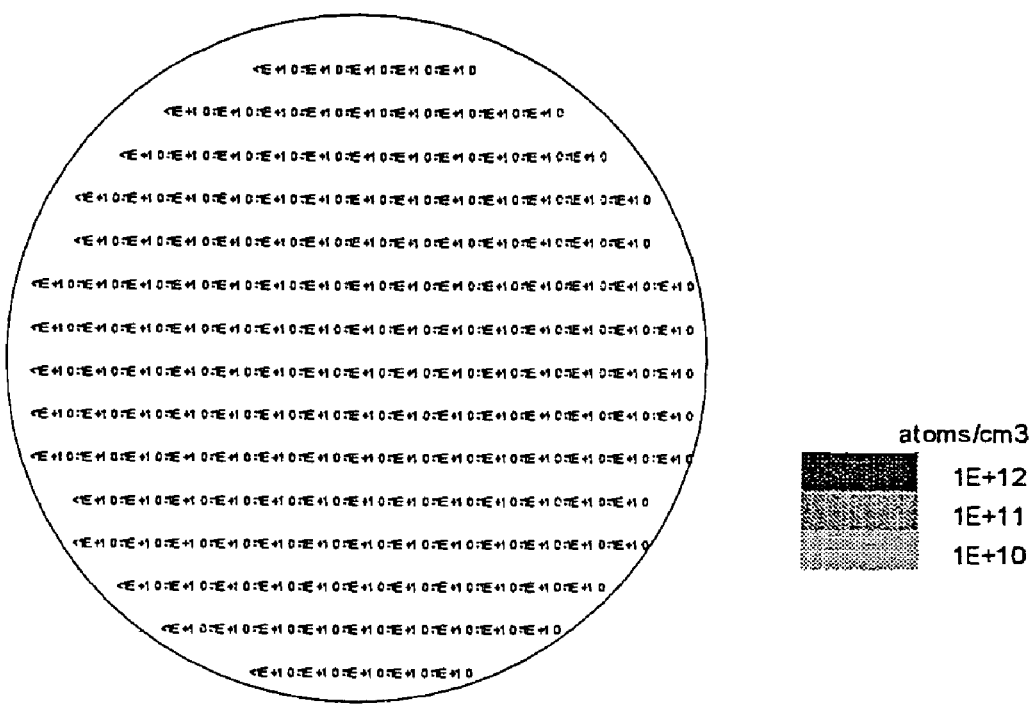
FIG. 4 is a Fe concentration map in a plane of a silicon wafer produced in Example 1.

As a result, a Fe concentration map in a plane as shown in FIG. 4 could be obtained. It was confirmed that Fe concentration was $1\times10^{10}$ atoms/cm$^3$ or less in the entire surface of the wafer, particularly there was not such Fe contamination as Fe concentration being more than $1\times10^{10}$ atoms/cm$^3$ even in a peripheral part thereof.

EXAMPLE 2

Figure 5:
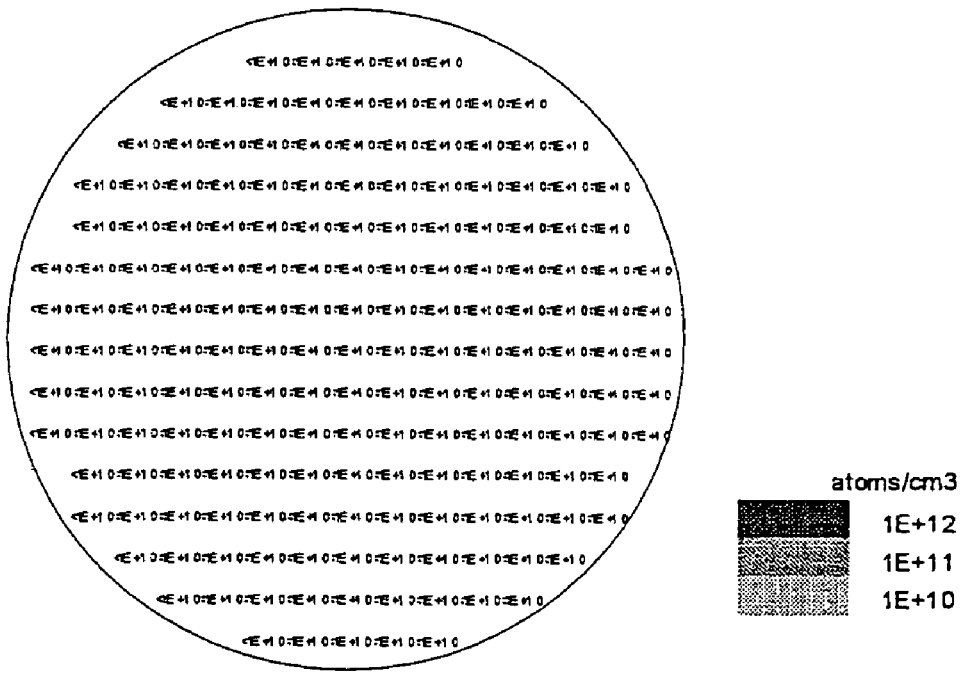
FIG. 5 is a Fe concentration map in a plane of a silicon wafer produced in Example 2.

A silicon single crystal was grown by a same manner as Example 1 except for the pressure in the chamber being 80 hpa (corresponding to 0.4 D). And there was measured Fe distribution in the peripheral part of the wafer produced from the obtained silicon single crystal. The measurement result shown in FIG. 5 was obtained and it was confirmed that there was not such Fe contamination as a Fe concentration of more than $1\times10^{10}$ atoms/cm$^3$ even in a peripheral part thereof.

COMPARATIVE EXAMPLE 1, 2

A conventional crystal (a diameter of 200 mm) having many grown-in defects (V region) by using the same single crystal-producing apparatus as Example 1 was produced on the following condition. The flow amount of Ar gas was adjusted to 80 L/min (corresponding to 0.4 D), the pressure in the furnace to 300 hPa (corresponding to 1.5 D), and the growth rate to 1.0 mm/min (Comparative Example 1). The other conditions were the same as Example 1.

Moreover, a silicon single crystal having low defect density was grown at a growth rate of 0.5 mm/min under the same flow amount of Ar gas (80 L/min) and the same pressure (300 hpa) as described above (Comparative Example 2).

A silicon wafer was produced from each of the grown single crystals and Fe distribution in a plane of the wafer was measured as described above.

Figure 6:
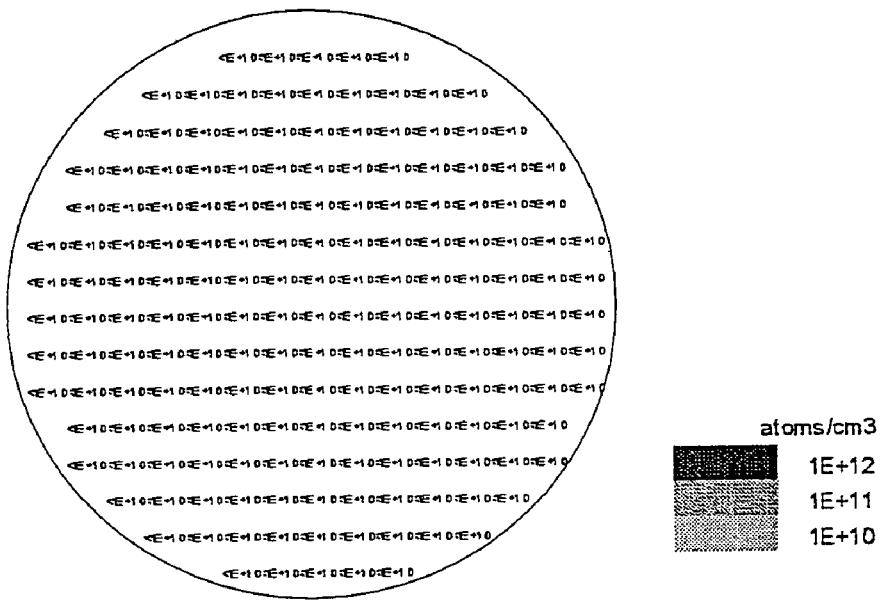
FIG. 6 is a Fe concentration map in a plane of a silicon wafer produced in Comparative Example 1.

In the wafer of Comparative Example 1, there was no Fe contamination even in a peripheral part thereof as shown in FIG. 6, however there were many grown-in defects in the entire plane of the wafer. In addition, the reason why there was no Fe contamination in a peripheral part thereof is thought that the pulling rate was high, Fe adhering to a surface of the crystal was small, and Fe diffusing inward in the crystal was small.

Figure 7:
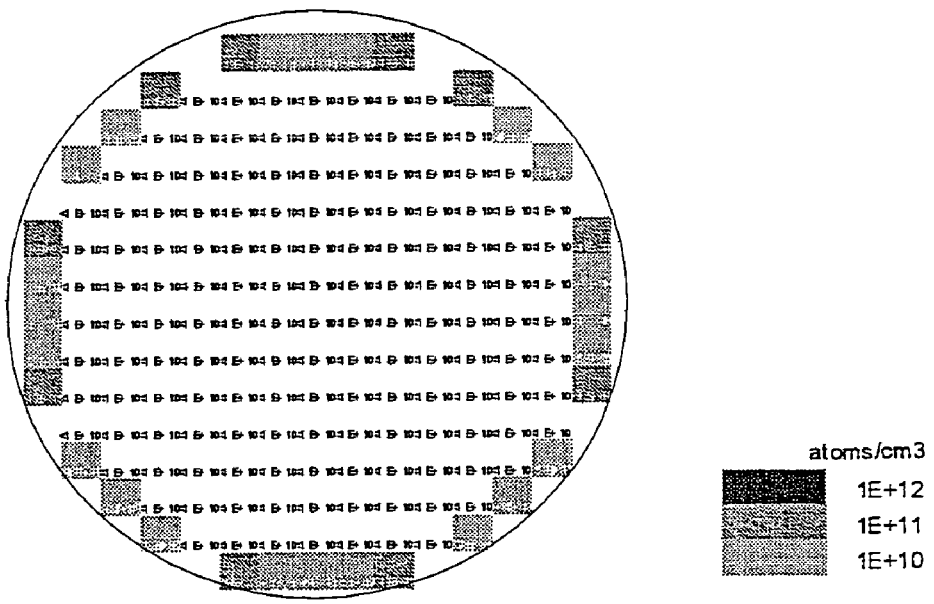
FIG. 7 is a Fe concentration map in a plane of a silicon wafer produced in Comparative Example 2.
Figure 8:
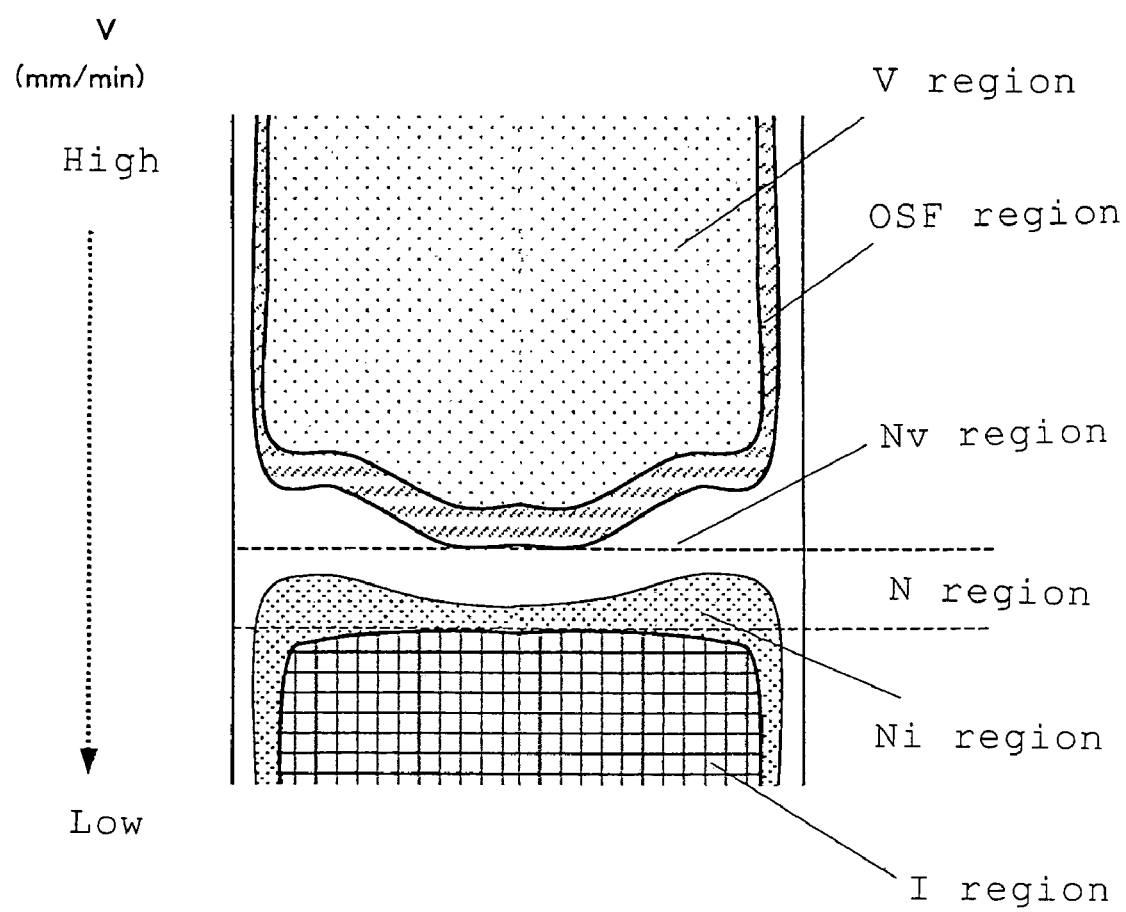
FIG. 8 is a view showing relation between growth rate and defect distribution of a single crystal grown according to CZ method.

On the other hand, the wafer obtained in Comparative Example 2 had low defect density, however, it was confirmed that as shown in FIG. 7, Fe concentration near 10-30 mm from a periphery of the wafer was more than $1\times10^{11}$ atoms/cm$^3$, and also a part with further more than $1\times10^{12}$ atoms/cm$^3$ was shown, and Fe contamination occurred. This is thought because flow amount of Ar gas was smaller than that in Example 1 and much Fe adhered to a surface of the crystal during growth and a part of them was diffused inside the crystal.

In addition, the present invention is not limited to the embodiments described above. The above-described embodiments are merely examples, and those having the substantially same constitution as that described in the appended claims and providing the similar working effects are included in the scope of the present invention.

For example, the used single crystal-pulling apparatus is not limited to the one in FIG. 1 and there can be used all of the pulling apparatus that have a gas flow-guide cylinder and can be grown a single crystal so that the entire crystal becomes N region. Also, the inert gas is not limited to Ar, and the present invention can be applied in the case that other gases such as helium and nitrogen are provided.

The invention claimed is:

1. A silicon single crystal wafer having a diameter of 200 mm or more produced in accordance with Czochralski method, wherein the wafer is occupied by N region outside OSF region generated in a ring shape in the radial direction of a single crystal, and Fe concentration of the entire plane in the radial direction including a peripheral part of the wafer is $1\times10^{10}$ atoms/cm$^3$ or less.

2. A method for producing a single crystal in accordance with Czochralski method by flowing an inert gas downward in a chamber of a single crystal-pulling apparatus and surrounding a single crystal pulled from a raw material melt with a gas flow-guide cylinder, wherein when a single crystal within N region outside OSF region generated in a ring shape in the radial direction of the single crystal is pulled, the single crystal within N region is pulled in a condition that flow amount of the inert gas between the single crystal and the gas flow-guide cylinder is 0.6 D(L/min) or more and pressure in the chamber is 0.6 D(hPa) or less, in which D (mm) is a diameter of the single crystal to be pulled.

3. The method for producing a single crystal according to claim 2, wherein the single crystal to be pulled is a silicon single crystal.

4. The method for producing a single crystal according to claim 3, wherein the diameter of the single crystal to be pulled is 200 mm or more.

5. The method for producing a single crystal according to claim 4, wherein the single crystal within N region is pulled by using the gas flow-guide cylinder that Fe concentration is 0.05 ppm or less, at least, in a surface thereof.

6. The method for producing a single crystal according to claim 3, wherein the single crystal within N region is pulled by using the gas flow-guide cylinder that Fe concentration is 0.05 ppm or less, at least, in a surface thereof.

7. The method for producing a single crystal according to claim 2, wherein the diameter of the single crystal to be pulled is 200 mm or more.

8. The method for producing a single crystal according to claim 7, wherein the single crystal within N region is pulled by using the gas flow-guide cylinder that Fe concentration is 0.05 ppm or less, at least, in a surface thereof.

9. The method for producing a single crystal according to claim 2, wherein the single crystal within N region is pulled by using the gas flow-guide cylinder that Fe concentration is 0.05 ppm or less, at least, in a surface thereof.

* * * * *